United States Patent
Akita

(10) Patent No.: US 9,313,888 B2
(45) Date of Patent: Apr. 12, 2016

(54) PACKAGE

(71) Applicant: NGK Spark Plug Co., Ltd., Nagoya-shi, Aichi-ken (JP)

(72) Inventor: Kazushige Akita, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/459,596

(22) Filed: Aug. 14, 2014

(65) Prior Publication Data

US 2015/0047893 A1 Feb. 19, 2015

(30) Foreign Application Priority Data

Aug. 19, 2013 (JP) ................................. 2013-169745

(51) Int. Cl.
| | |
|---|---|
| *H05K 1/16* | (2006.01) |
| *H05K 1/11* | (2006.01) |
| *H01L 23/053* | (2006.01) |
| *H03H 9/10* | (2006.01) |

(52) U.S. Cl.
CPC .............. *H05K 1/111* (2013.01); *H01L 23/053* (2013.01); *H03H 9/1014* (2013.01); *H03H 9/1071* (2013.01); *H01L 2224/16225* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2005/0055814 | A1 | 3/2005 | Hatanaka et al. |
| 2005/0056458 | A1* | 3/2005 | Sugiura .......................... 174/260 |
| 2008/0266003 | A1* | 10/2008 | Yamashita ....................... 331/68 |

FOREIGN PATENT DOCUMENTS

| | | |
|---|---|---|
| JP | S53-7172 A | 1/1978 |
| JP | H04-3609 A | 1/1992 |
| JP | 2007-173974 A | 7/2007 |
| JP | 2012-129775 A | 7/2012 |

OTHER PUBLICATIONS

JP 2007-173974 English translation.*
European Patent Office, European Search Report, from corresponding EP Application No. 14181333, dated Feb. 11, 2015.

* cited by examiner

*Primary Examiner* — Steven T Sawyer
(74) *Attorney, Agent, or Firm* — Stites & Harbison, PLLC; Jeffrey A. Haeberlin; James R. Hayne

(57) ABSTRACT

Embodiments of the present packages comprise a package body that is made of an insulating material, has a front surface and a back surface, and has a rectangular shape in plan view, a metal layer that is formed along a peripheral portion of the front surface of the package body and that has a frame shape in plan view, a metal frame that is joined to the metal layer with a brazing material and has a frame shape in plan view, a pair of electrode pads that are formed on the front surface of the package body surrounded by the metal layer and configured to mount a crystal oscillator, and an opening portion of a cavity opened in a position that excludes the pair of electrode pads, wherein the metal layer, the pair of electrode pads, and the opening portion of the cavity are positioned in the same plane.

3 Claims, 4 Drawing Sheets

PACKAGE

CROSS REFERENCE TO RELATED APPLICATIONS

This application is based upon and claims the benefit of priority of Japanese Patent Application No. 2013-169745, filed on Aug. 19, 2013, the contents of which are incorporated herein by reference in its entirety.

BACKGROUND OF THE INVENTION

1. Field of the Invention

The present invention relates to a package capable of mounting a crystal oscillator on a front surface of a package body and also mounting an electronic component inside a cavity formed in the package body.

2. Description of Related Art

For example, in order to be able to perform surface mounting of a crystal piece and mount an IC chip, a crystal oscillator for surface mounting, in which ceramic plates of three layers are stacked to form a container body and a peripheral portion on a front surface of the relatively thin-walled ceramic plate of the uppermost layer, is brazed with a seal ring (metal frame). Furthermore, an end portion of the crystal piece is bonded and supported to a front surface of the relatively thick-walled ceramic plate of the middle layer, an opening portion is formed in the front surface of the ceramic plate of the middle layer excluding the bonded portion of the crystal piece, and the IC chip can be mounted inside a cavity using a front surface of the ceramic plate of the lowermost layer as a bottom surface, has been proposed. See, for example, Patent Document 1.

However, the crystal oscillator had a problem that the thickness of the whole container body tends to become thick since the ceramic plates of three layers are stacked to form the container body.

Further, for example, in the case in which the seal ring joined to the ceramic plate of the uppermost layer is misaligned or a lamination misalignment between the mutual ceramic plates of the uppermost layer and the middle layer occurs, there was also a problem of becoming difficult to obtain space for the bonded portion for bonding the end portion of the crystal piece to the front surface of the ceramic plate of the middle layer.

Consequently, it was difficult to respond to needs for miniaturization of the whole including thinning of the container body in the crystal oscillator.

RELATED ART DOCUMENTS

Patent Document 1 is Japanese Patent Application 2012-129775 (Pages 1 to 7, FIGS. 1 to 7).

BRIEF SUMMARY OF THE INVENTION

The invention solves the problems described in the background art, and an object of the invention is to provide a package capable of surface mounting of a crystal oscillator and also mounting of an electronic component inside a cavity. Another object is to achieve thinning (decrease in height) of a package body and miniaturization of the whole including the thinning.

In order to solve the problems described above, the invention is made with a metal layer brazed with a metal frame to make a seal, an electrode for supporting a crystal oscillator, and an opening portion of a cavity for mounting an electronic component that are all formed in the same plane in a package body including an insulating material.

A package, comprising: a package body that is made of an insulating material, has a front surface and a back surface, and has a rectangular shape in plan view; a metal layer that is formed along a peripheral portion of the front surface of the package body and that has a frame shape in plan view; a metal frame that is joined to the metal layer with a brazing material and that has a frame shape in plan view; a pair of electrode pads that are configured to mount a crystal oscillator and that are formed on the front surface of the package body surrounded by the metal layer; and an opening portion of a cavity opened in a position that excludes the pair of electrode pads; wherein the metal layer, the pair of electrode pads, and the opening portion of the cavity are positioned in the same plane.

Accordingly, the frame-shaped metal layer formed along the peripheral portion of the front surface of the package body, the pair of electrode pads for mounting the crystal oscillator, which are formed on the front surface of the package body, and the opening portion of the cavity opened in the region excluding the pair of electrode pads are positioned on the front surface of the package body on the same plane. As a result, the whole thickness of the package body can easily be thinned (decrease in height) since the package body is able to be formed of insulating layers of at least two layers as described below.

Moreover, even when a punch position misalignment occurs on the front surface of the package body at the time of punching for forming the cavity, space necessary for arrangement of the pair of electrode pads for mounting the crystal oscillator can easily be obtained. Further, even when a lamination misalignment occurs between the upper and lower insulating layers, space necessary for the pair of electrode pads for mounting the crystal oscillator can easily be obtained in the front surface of the package body surrounded by the metal layer.

Consequently, the package capable of surface mounting the crystal oscillator and an electronic component and achieving thinning of the package body and miniaturization as a whole can be provided.

In other words, the package of the invention is characterized in that the metal layer and the pair of electrode pads are formed on the front surface of the insulating layer that is the uppermost layer of the plural insulating layers of the package body in which the cavity is formed.

In addition, the insulating material constructing the package body is a material obtained by stacking two ceramic layers or two resin layers, as described below. It is recommended that the ceramic layer or the resin layer of the lower layer side of the two layers has a minimum thickness necessary to maintain the strength of the package body and a bottom surface of the cavity.

Also, as the metal layer and the pair of electrodes, when the insulating material of the package body is made of a ceramic, W, Mo, Cu, Ag, or the like capable of being fired simultaneously with the ceramic are used. On the other hand, when the insulating material of the package body is made of a resin, Cu, Ag, or the like cured by heating or light (UV) irradiation after printing, conductive paste is used.

Further, as the brazing material, for example, an Ag brazing material is used.

Also, the metal frame includes, for example, 42 alloy (Fe-42% Ni), kovar (Fe-29% Ni-17% Co), 194 alloy (Cu-2.3% Fe-0.03% P), or various stainless steels.

Further, the frame-shaped metal layer and the frame-shaped metal frame have a rectangular shape, an elliptical shape, an oval shape, or deformed polygons or regular polygons more than or equal to a pentagon in plan view.

Furthermore, a metal lid for sealing the crystal oscillator or the like mounted on the front surface of the package body from the outside can be later attached to a front surface of the frame-shaped metal frame.

Also, the invention includes a package (claim 2) wherein groove along a place between the metal layer and the pair of electrode pads formed in the front surface of the package body is located between the metal layer and the pair of electrode pads.

Accordingly, even when a part of the brazing material flows out on the front surface of the package body surrounded by the metal layer due to a print misalignment of the metal layer or the case where a position of the metal frame is misaligned on the front surface of the package body in the case of brazing on the metal layer, or the case where the brazing material used in the joining becomes excessive locally, the groove can prevent such a brazing material from making contact with the pair of electrode pads. Consequently, a malfunction of the crystal oscillator can be prevented, and the metal layer and the pair of electrode pads can be arranged in a relatively near position on the same front surface of the package body, with the result that the package with the miniaturized package body can easily be obtained.

In addition, the groove is formed by, for example, laser processing, press processing of a metal mold, or inserting of a knife on a ceramic layer of the upper layer side, a resin layer, or a green sheet used as the ceramic layer. In case of the laser processing, the groove may be formed after brazing of the metal frame.

Also, a cross sectional shape of the groove can have a rectangular shape, a V shape, an inverted trapezoidal shape, or the like, and a shape of the whole groove in plan view can have a U shape, a pair of symmetrical L shapes, or one or plural I shapes.

Further, the invention includes a package (claim 3) wherein the package body includes two vertically stacked insulating layers (i.e., is made by stacking two vertical insulating layers), and the cavity is comprised of a through hole formed in the uppermost of the insulating layers and a front surface of the lowermost of the insulating layers forms a bottom surface of the through hole that is closed (i.e., the cavity is formed of a through hole through the upper layer side insulating layer and a front surface of the lower layer side insulating layer, which forms a bottom surface of the cavity, or, in other words, closes the through hole).

Accordingly, the metal layer, the pair of electrode pads and the opening portion of the cavity can be arranged in the same front surface of the package body, and plural terminals joined to mounting electrodes of an electronic component mounted on a front surface of the insulating layer of the lower layer side used as a bottom surface of the cavity can be arranged. Consequently, the whole thickness is minimized, and the package including the package body with little adverse effect by a lamination misalignment can be obtained.

In addition, the insulating layers of the two vertical layers can be made of ceramic layers obtained by stacking a frame-shaped green sheet and a flat-plate green sheet and firing the green sheets simultaneously with the metal layer, the pair of electrode pads, or the like, or a resin layer of two layers can be obtained by printing and forming a frame-shaped resin layer on a ceramic plate or a resin plate of the lower layer side, or a laminated body of a ceramic layer and a resin layer.

Moreover, the invention includes a package (claim 4) wherein a depth of the through hole through the insulating layer of the upper layer side is larger than the sum of a thickness of an electronic component to be mounted in the cavity and a thickness of each of plural mounting electrodes formed on the front surface of the insulating layer of the lower layer side.

Accordingly, even with the electronic component mounted inside the cavity, an upper surface (ceiling surface) of the electronic component does not reach the opening portion of the cavity. As a result, when one end portion of the crystal oscillator is joined and supported to the front surface of the package body in which the cavity is opened, the upper surface of the electronic component is resistant to making contact with a bottom portion of the crystal oscillator, with the result that accurate performance or operation of the crystal oscillator can be ensured easily.

In addition, an IC chip or a semiconductor device is illustrated as being an exemplary electronic component.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment for carrying out the invention will hereinafter be described.

Figure 1:
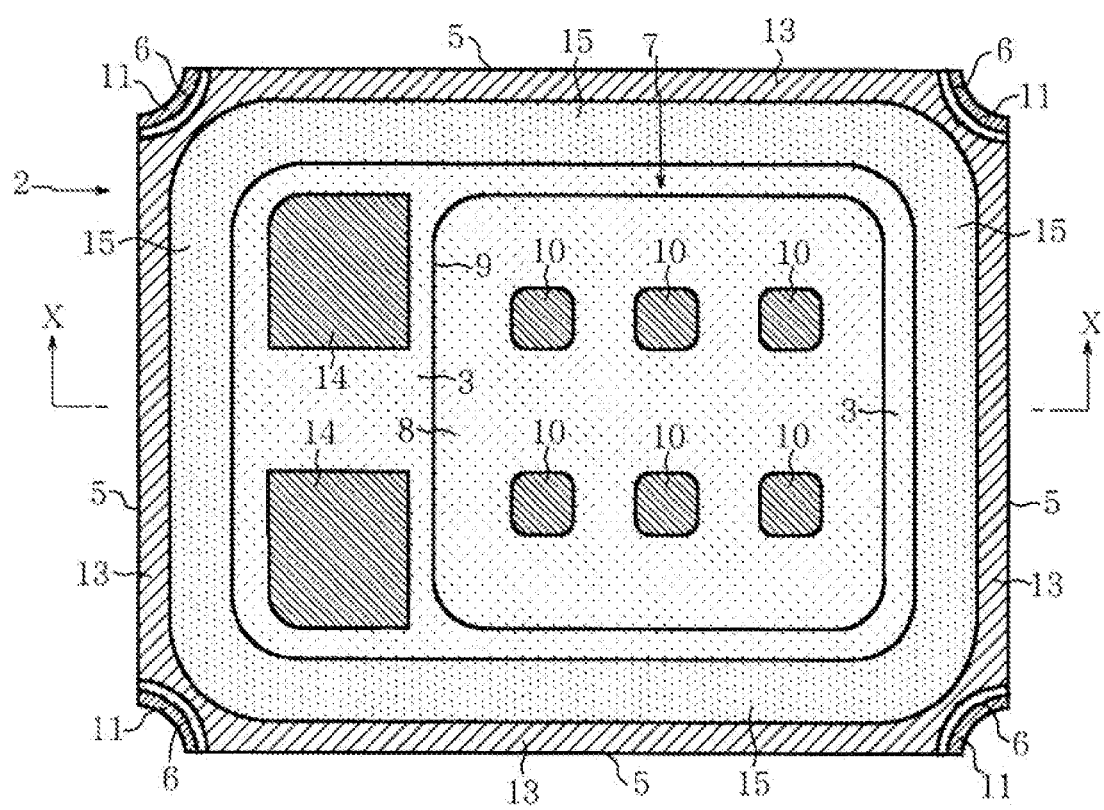
FIG. 1 is a plan view showing a package of one embodiment according to the invention.
Figure 2:
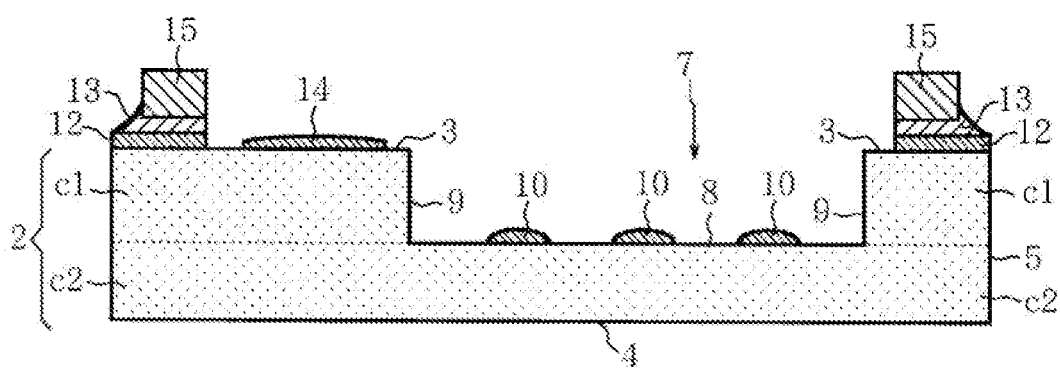
FIG. 2 is a vertical sectional view along line X-X in FIG. 1.

FIG. 1 is a plan view showing a package 1a of one embodiment according to the invention, and FIG. 2 is a vertical sectional view along line X-X in FIG. 1.

As shown in FIGS. 1 and 2, the package 1a includes a package body 2 which includes two vertically stacked ceramic layers (insulating layers) c1, c2 and has a front surface 3 and a back surface 4 with a rectangular shape in plan view, a metal layer 12 which is formed along a peripheral portion of the front surface 3 of the package body 2 and has a rectangular frame shape in plan view, and a metal frame 15 which is joined on the metal layer 12 through a brazing material 13 and has a rectangular frame shape in plan view.

In addition, the ceramic layers c1, c2 principally include, for example, alumina (insulating material), and the metal layer 12 is made of W, Mo, or an alloy based on any one of W and Mo, and a front surface of the metal layer 12 is sequentially coated with Ni and Au plated films (not shown). Also, the brazing material 13 is made of, for example, an Ag brazing material, and the metal frame 15 is made of, for example, Kovar.

A pair of electrodes 14 for joining and mounting one end side of a crystal oscillator (not shown) mounted later is formed on the left side in FIG. 1 and on the front surface 3 of the package body 2 surrounded by the metal layer 12. Further, the opening portion of a cavity 7 is formed in the front surface 3 is a region that excludes where the pair of electrodes 14 is formed. Also, the pair of electrodes 14 are is made of W, Mo, or an alloy based on any one of W and Mo, and a front surface of the pair of electrode pads 14 is sequentially coated with Ni and Au plated films.

The cavity 7 includes a bottom surface 8 which is a front surface of the ceramic layer c2 of the lower layer (lowermost insulating layer), side surfaces 9 of four sides which are inner surfaces of a through hole, a rectangular shape in plan view, wherein the bottom surface 8 is provided with plural mounting electrodes 10 for mounting electronic components such as an IC chip or a thermistor element mounted later. Also, the mounting electrode 10 is made of W, Mo, or an alloy based on any one of W and Mo, and a front surface of the mounting electrode 10 is sequentially coated with Ni and Au plated films in a manner similar to the metal layer 12. In addition, the total number of mounting electrodes 10 is freely selected as long as the number is two or more.

Further, as shown in FIG. 1, a concave portion 6 with a circular-arc shape recessed in the center side in plan view is positioned in each corner portion between side surfaces 5, 5 of four sides of the package body 2, and a concave conductor 11 is individually formed on a front surface of each concave portion 6 between the front surface 3 and the back surface 4. The concave conductor 11 can conduct to any of the plural mounting electrodes 10 or the pair of electrodes 14 through internal wiring (not shown).

In addition, the concave conductor 11 is made of W, Mo, or an alloy based on any one of W and Mo, and the upper end portion of the concave conductor 11 does not make contact with the brazing material 13, but the upper end portion of any of the concave conductors 11 may make contact.

Figure 3:
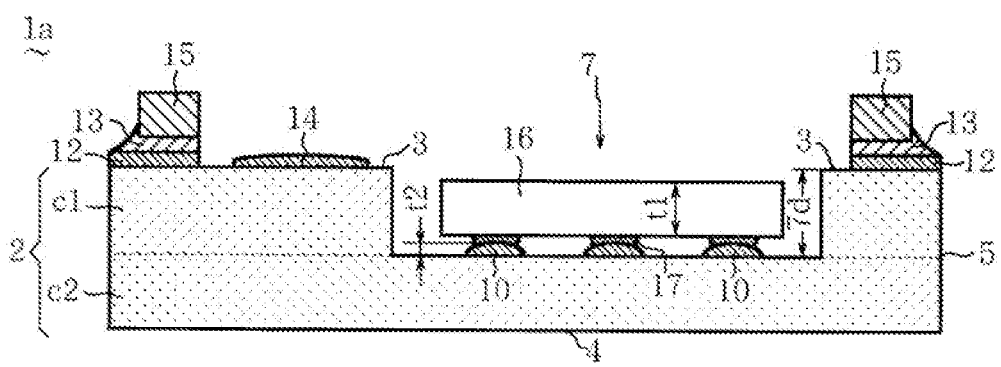
FIG. 3 is a schematic view showing a state in which an electronic component is mounted in a cavity of the package.

FIG. 3 is a vertical sectional view similar to FIG. 2, showing a state in which an IC chip (electronic component) 16 is later mounted inside the cavity 7 of the package 1a.

As shown in FIG. 3, plural electrodes (not shown) positioned on a bottom surface of the IC chip 16 are individually joined on the plural mounting electrodes 10 formed on the bottom surface 8 of the cavity 7 through a solder 17. In this case, an upper surface of the IC chip 16 is in a position lower than the front surface 3 of the package body 2.

That is, a depth 7d of the cavity 7 is larger than the sum of a thickness t1 of the IC chip 16 and a thickness t2 of the mounting electrode 10 (7d>(t1+t2)). Strictly, the depth 7d of the cavity 7 is larger than the sum of three thicknesses of the thicknesses t1, t2, and a thickness of the solder 17. As a result, accurate performance of the crystal oscillator can be ensured since the upper surface of the IC chip 16 is resistant to making contact with a bottom portion of the crystal oscillator when one end portion of the crystal oscillator is later joined and mounted to a pair of electrode pads 14 formed on the front surface 3 of the package body 2 in which the cavity 7 is opened.

The package 1a as described above is manufactured in the following manner.

Two large-sized green sheets for multiple pieces were previously prepared, and plural package regions used as an upper layer side or a lower layer side of the package body 2 were set in the center side of each of the green sheets in plural places along vertical and horizontal directions in plan view, and plural via holes were formed inside each of the package regions, and through holes were formed in corner portions between the four adjacent package regions and corner portions between a peripheral edge portion and a gap between the two package regions. Further, a through hole with a rectangular shape in plan view was punched in each package region in the green sheets having plural package regions used as the ceramic layer c1 of the upper layer side (uppermost insulating layer).

Next, each of the via holes and the through holes formed in each of the two green sheets was filled with conductive paste including W or Mo powder, or surface printing of the conductive paste was done on each of the via holes and the through holes.

Then, a pair of unbaked electrodes 14 and an unbaked metal layer 12 which surrounds the pair of electrodes 14 and has a rectangular frame shape in plan view were formed by screen printing conductive paste similar to the above on a front surface of the periphery of the through hole in each of the package regions used as the ceramic layer c1 of the upper layer side later.

Further, plural unbaked mounting electrodes 10 were formed by screen printing of conductive paste similar to the above on a front surface of each of the package regions used as the ceramic layer c1 of the lower layer side later. Next, after the two green sheets were stacked and pressed, a green sheet laminated body obtained was fired. Then, a ceramic laminated body after firing was sequentially immersed in an electrolytic Ni plating bath and an electrolytic Au plating bath, and a front surface of each cylindrical conductor formed along an inner surface of each of the plural mounting electrodes 10, the metal layer 12, the pair of electrodes 14, and the through holes after firing was sequentially coated with an Ni plated film and an Au plated film.

Then, plural packages 1a were obtained by individually dividing the ceramic laminated body along boundary lines for dividing the plural package regions.

According to the package 1a as described above, the rectangular frame-shaped metal layer 12 formed along the peripheral portion of the front surface 3 of the package body 2, a pair of electrode pads 14 for mounting the crystal oscillator, which are formed on the front surface 3 of the package body 2, and an opening portion of the cavity 7 opened in a position that excludes the pair of electrode pads 14 on the front surface 3 of the package body 2 surrounded by the metal layer 12 are positioned on the front surface 3 of the package body 2 which is on the same plane. As a result, the whole thickness of the package body 2 can easily be thinned (decrease in height) since the package body 2 can be formed of only the ceramic layers (insulating layers) c1, c2 of two layers.

Moreover, even when a position of the metal frame 15 joined on the metal layer 12 is transversely misaligned on the front surface 3 of the package body 2 or a lamination misalignment occurs between the vertical ceramic layers c1, c2, space necessary for arrangement of the pair of electrode pads 14 can easily be obtained in the front surface 3 of the package body 2 surrounded by the metal layer 12.

Consequently, the package 1a capable of performing surface mounting of the crystal oscillator and also mounting the IC chip 16 and achieving thinning of the package body 2 and miniaturization as a whole can be obtained.

Figure 4:
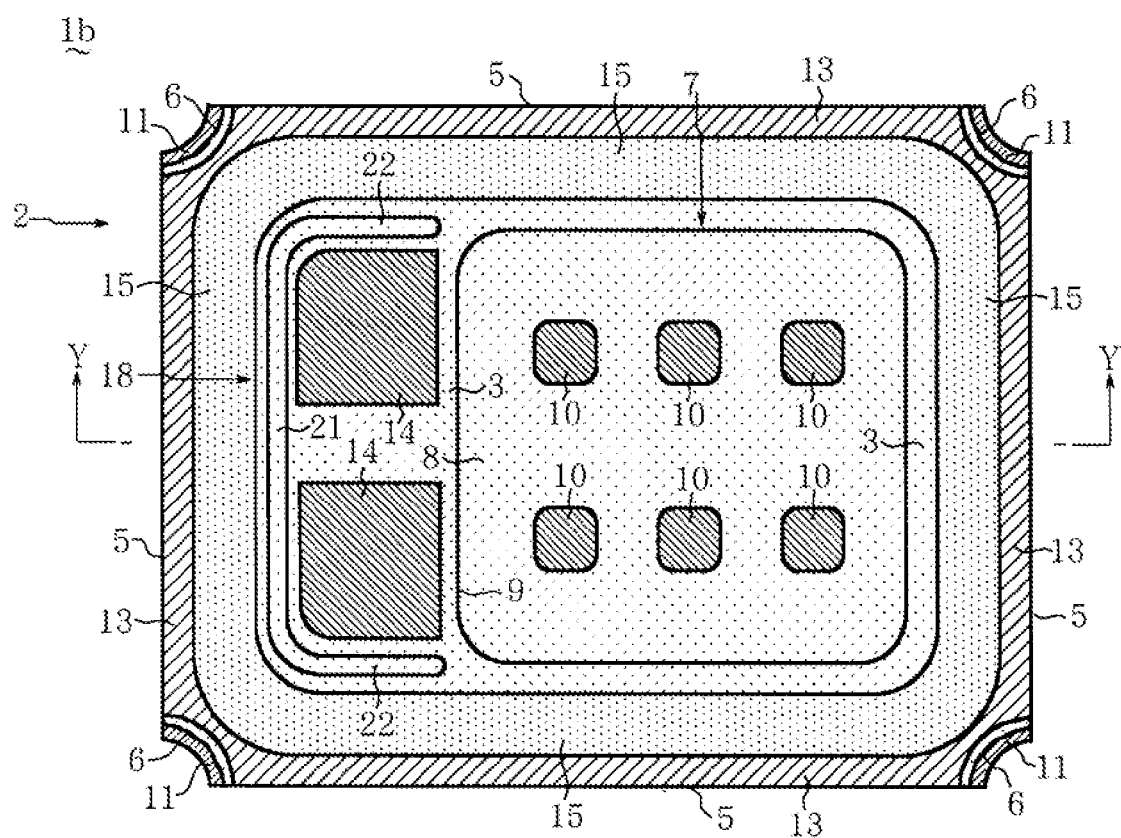
FIG. 4 is a plan view showing a package in accordance with another embodiment.
Figure 5:
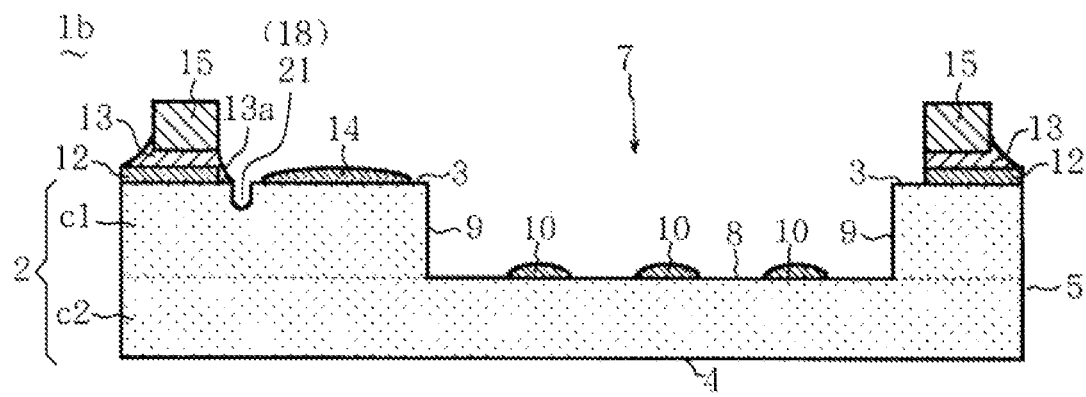
FIG. 5 is a vertical sectional view along line Y-Y in FIG. 4.

FIG. 4 is a plan view showing another embodied package 1b that is a modified form of the package 1a, and FIG. 5 is a vertical sectional view along line Y-Y in FIG. 4.

As shown in FIGS. 4 and 5, the package 1b includes a package body 2 similar to the above, a metal layer 12, a metal frame 15, a pair of electrode pads 14, a cavity 7, and plural mounting electrodes 10, and the metal layer 12, the pair of electrode pads 14, and an opening portion of the cavity 7 are positioned in a front surface 3 of the package body 2 which is the same plane.

Further, in the package 1b, a groove 18 with a generally U shape in plan view is formed in the front surface 3 of the package body 2 located between the metal layer 12 and the pair of electrode pads 14. The groove 18 includes a long groove portion 21 longitudinally extending in FIG. 4, and a pair of short groove portions 22 transversely extending from both ends of the groove portion 21, and a cross section of the groove 18 has a U shape as shown in FIG. 5.

The groove portions 21, 22 comprising the groove 18 are formed by, for example, performing laser processing, pressing a metal mold with a protruding stripe having a U shape in bottom view, or inserting a knife one or plural times on a front surface of each package region in a green sheet having the package regions used as the ceramic layer c1 of the upper layer side later. In addition, a cross sectional shape of the groove portion 21, 22 may be a V shape, a rectangular shape, an inverted trapezoidal shape or the like.

According to the package 1b as described above, in addition to the effect by the package 1a, for example, even when a part of the brazing material 13a in a brazing material 13 flows out on the front surface 3 of the package body 2 inside the metal layer 12 in the case of joining the metal frame 15 on the metal layer 12 of the left side in FIG. 5, the groove 18 can prevent the brazing material 13a from making contact with the pair of electrode pads 14 carelessly. Consequently, the package 1b can further have an effect capable of ensuring accurate operation of a crystal oscillator (not shown) whose one end portion is joined and mounted to the electrode pads 14.

When the brazing material 13 becomes excessive locally or when a print misalignment of the metal layer 12 or a joining misalignment of the metal frame 15 occurs, the brazing material 13a flows out, but the groove 18 can prevent the brazing material 13a from making contact with the electrode pads 14.

Figure 6:
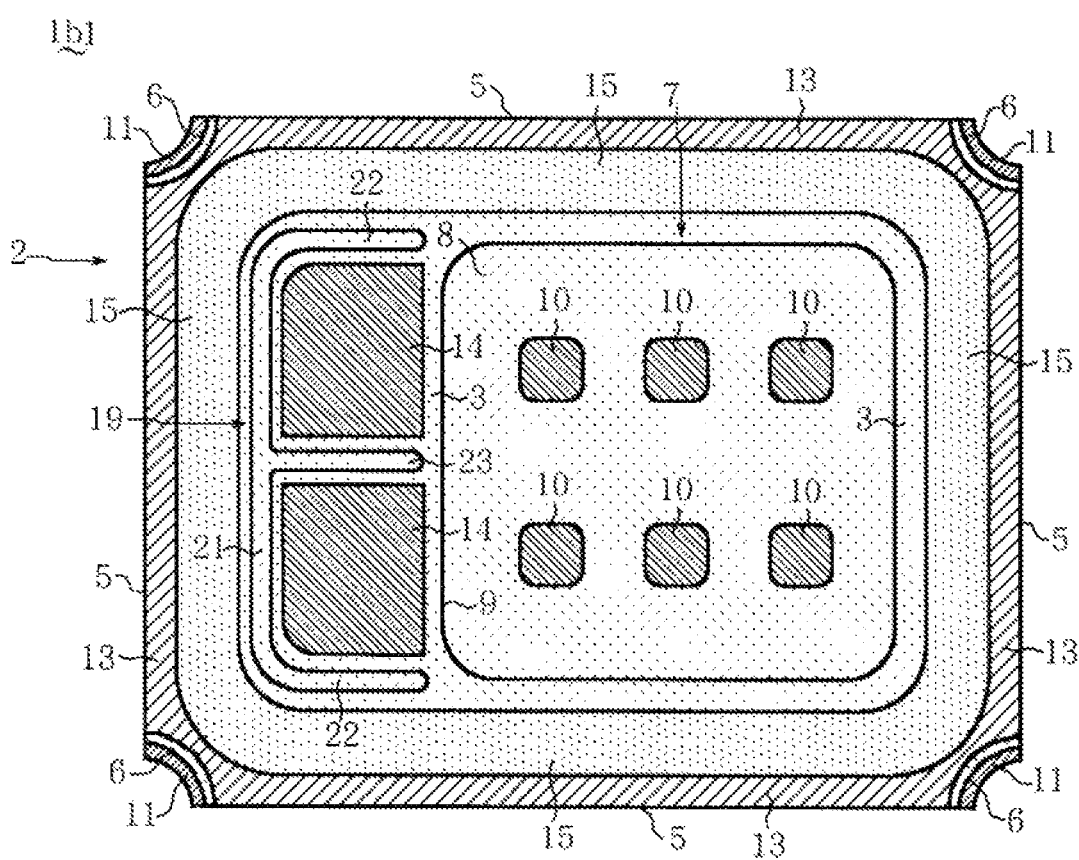
FIG. 6 is a plan view showing a package in accordance with yet another embodiment.

FIG. 6 is a plan view showing a package 1b1 of an applied form of the package 1b.

In the package 1b1, a groove 19 with a generally E shape in plan view is formed in a front surface 3 of a package body 2 between the metal layer 12 and the pair of electrode pads 14 (i.e., along a place between a metal layer 12 and a pair of electrode pads 14 in a front surface 3 of a package body 2) as shown in FIG. 6. In the groove 19, in addition to the groove portions 21, 22, a transverse groove portion 23 is further added and formed in the front surface 3 of the package body 2 between the pair of electrode pads 14 from the middle of the longitudinal groove portion 21.

By adding the groove portion 23, the groove portion 23 is also formed in the front surface 3 of the package body 2 between the electrode pads 14, 14 even when the pair of electrode pads 14 is formed mutually adjacently as shown in FIG. 6. As a result, according to the package 1b1, a careless short circuit between the pair of mutual electrode pads 14 can be prevented in addition to the effect by the package 1b.

Figure 7:
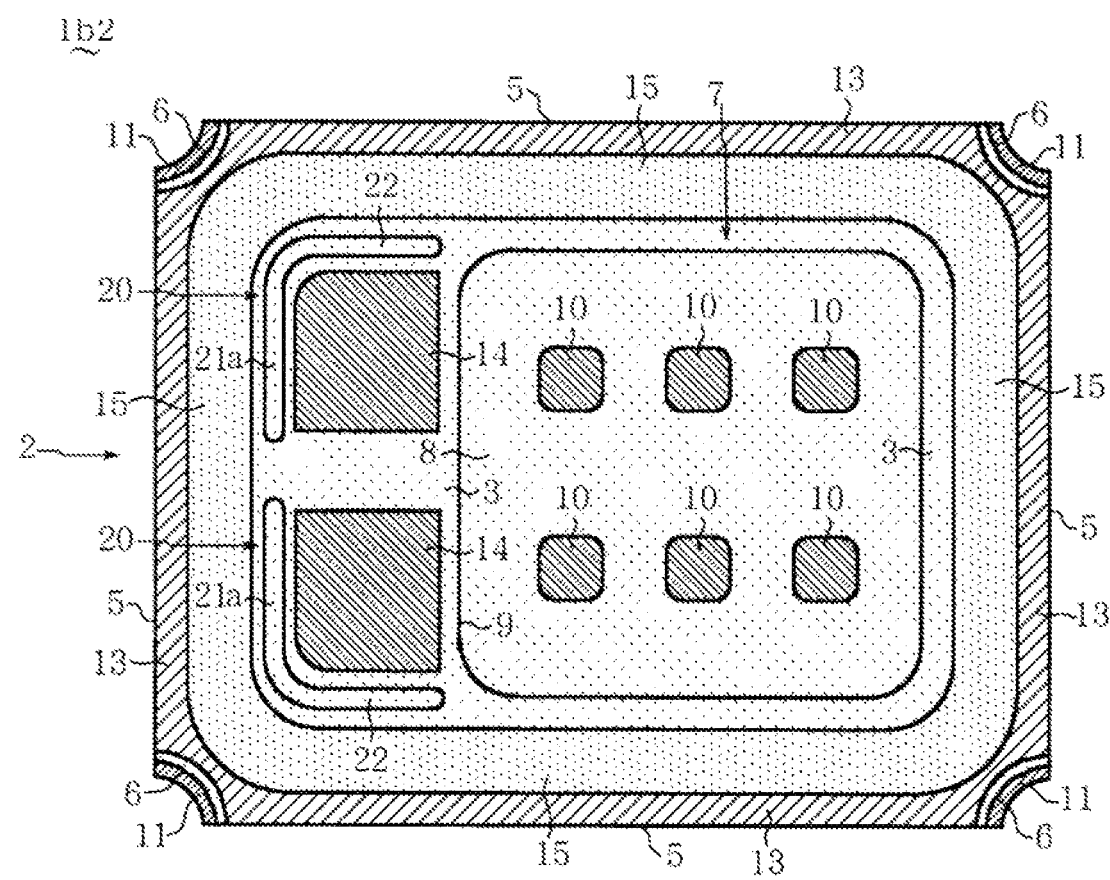
FIG. 7 is a plan view showing a different embodiment of the package.

FIG. 7 is a plan view showing a package 1b2 of a different modified embodiment of the package 1b.

In the package 1b2, a pair of grooves 20 with a generally L shape in plan view are symmetrically formed in a front surface 3 of a package body 2 between the metal layer 12 and the pair of electrode pads 14 (i.e., along a place between a metal layer 12 and a pair of electrode pads 14 in a front surface 3 of a package body 2) as shown in FIG. 7. Each of the grooves 20 includes a longitudinally short groove portion 21a, and a groove portion 22 transversely extending from one end of the groove portion 21a.

The package 1b2 having the pair of grooves 20 can also have an effect similar to that of the package 1b.

In addition, the grooves 18 to 20 may have a form in which the groove portions 21, 21a, 22, 23 constructing these grooves are individually formed in the front surface 3 of the package body 2 without being connected mutually. Also, the grooves 18 to 20 may have a form of being made only by any of the groove portions 21, 21a, 22.

The invention is not limited to each embodiment described above.

For example, the package body may have a form of having a square shape in plan view.

Also, an insulating material forming the package body may be, for example, a polyimide resin or an epoxy resin. Resin insulating layers of two vertical layers made of such a resin may be formed by, for example, applying a copper foil resin plate to the lower layer side and performing a roll coating or screen printing of insulating paste used as a resin insulating layer of the upper layer side on a front surface of the resin plate.

Further, the metal layer or the metal frame is not limited to the form of having the rectangular frame shape in plan view, and may have forms of having an elliptical frame shape, an oval frame shape, or frame shapes of deformed polygons or regular polygons more than or equal to a pentagon in plan view.

Also, the brazing material 13 is not limited to the Ag brazing material and, for example, an Au brazing material, a brass brazing material, or an Al brazing material may be used.

Further, the package body 2 may have a form of omitting a part or all of the concave conductor 11 or the concave portion 6 formed in each corner portion between the side surfaces 5, 5.

Moreover, the cavity may have a form of annexing two or more cavities individually opened in the same front surface of the package body.

INDUSTRIAL APPLICABILITY

Embodiments of the present invention can provide a package capable of performing surface mounting of a crystal oscillator, mounting an electronic component inside a cavity, and achieving thinning (decrease in height) of a package body and miniaturization of the whole including the thinning.

DESCRIPTION OF REFERENCE NUMERALS AND SIGNS 1a, 1b, 1b1, 1b2 ... PACKAGE
2 ... PACKAGE BODY
3 ... FRONT SURFACE
4 ... BACK SURFACE
7 ... CAVITY
7d ... DEPTH OF CAVITY
8 ... BOTTOM SURFACE OF CAVITY/FRONT SURFACE OF INSULATING LAYER
9 ... SIDE SURFACE OF CAVITY/THROUGH HOLE
10 ... MOUNTING ELECTRODE
12 ... METAL LAYER
13 ... BRAZING MATERIAL
14 ... PAIR OF ELECTRODE PADS
15 ... METAL FRAME
16 ... IC CHIP (ELECTRONIC COMPONENT)
18~20 ... GROOVE
c1, c2 ... CERAMIC LAYER (INSULATING LAYER)
t1 ... THICKNESS OF IC CHIP (ELECTRONIC COMPONENT)
t2 ... THICKNESS OF MOUNTING ELECTRODE

What is claimed is:

1. A package, comprising:
a package body that is made of an insulating material, has a front surface and a back surface, and has a rectangular shape in a plan view;
a metal layer that is formed along a peripheral portion of the front surface of the package body and that has a frame shape in a plan view;
a metal frame that is joined to the metal layer with a brazing material and that has a frame shape in a plan view;
a pair of electrode pads that are formed on the front surface of the package body surrounded by the metal layer;
an opening portion of a cavity opened in a position that excludes the pair of electrode pads; and
a groove formed in a layer on which the metal layer is formed and located on the front surface of the package body between the metal layer and the pair of electrode pads;
wherein the metal layer, the pair of electrode pads, and the opening portion of the cavity are positioned in the same plane.

2. The package according to claim 1, wherein:
the package body includes two vertically stacked insulating layers,
the cavity is comprised of a through hole formed in an uppermost of the insulating layers, and
a front surface of a lowermost of the insulating layers forms a bottom surface of the through hole that is closed.

3. The package according to claim 2, wherein a depth of the through hole through the insulating layers is larger than a sum of a thickness of an electronic component mounted in the cavity and a thickness of each of plural mounting electrodes formed on the front surface of the lowermost of the insulating layers.

* * * * *